United States Patent [19]
Becke et al.

[11] 4,364,073
[45] Dec. 14, 1982

[54] POWER MOSFET WITH AN ANODE REGION

[75] Inventors: Hans W. Becke, Morristown; Carl F. Wheatley, Jr., Somerset, both of N.J.

[73] Assignee: RCA Corporation, New York, N.Y.

[21] Appl. No.: 133,902

[22] Filed: Mar. 25, 1980

[51] Int. Cl.³ .............................................. H01L 29/00
[52] U.S. Cl. .......................................... 357/23; 357/37
[58] Field of Search ..................... 357/37, 38, 23, 23 R

[56] References Cited

U.S. PATENT DOCUMENTS

| | | | |
|---|---|---|---|
| 3,210,563 | 10/1965 | New | 357/38 |
| 3,324,359 | 6/1967 | Gentry | 357/38 |
| 3,900,771 | 8/1975 | Krause | 357/38 |
| 4,199,774 | 4/1980 | Plummer | 357/23 |

FOREIGN PATENT DOCUMENTS 1367325 9/1974 United Kingdom .
2034114 5/1980 United Kingdom .

*Primary Examiner*—R. A. Rosenberger
*Attorney, Agent, or Firm*—Birgit E. Morris; Donald S. Cohen; Kenneth R. Glick

[57] ABSTRACT

A vertical MOSFET device having source, body and drain regions, includes an anode region in series with the drain region. The source, body and drain regions have a first forward current gain and the anode, drain and body regions have a second forward current gain, such that the sum of the current gains is less than unity. The anode region provides minority carrier injection into the drain region, enhancing device performance in power applications.

17 Claims, 5 Drawing Figures

POWER MOSFET WITH AN ANODE REGION

BACKGROUND OF THE INVENTION

The present invention relates generally to insulated gate field effect transistors (IGFETs) such as metal oxide semiconductor FETs (MOSFETs). More particularly, it relates to vertical, double diffused MOSFETs (VDMOS) and vertical, grooved MOSFETs (VMOS) used in power applications.

A conventional IGFET is a unipolar transistor in which current flows from a source region, through a channel in a body region, to a drain region. The source, channel and drain regions are of N or P type conductivity and the body region is of opposite conductivity type. The channel is induced (in an enhancement type device) or removed (in a depletion type device) by means of an electrostatic field produced by charges on a nearby gate electrode. The gate electrode typically lies between source and drain electrodes (disposed respectively on the source and drain regions) and in a MOSFET device it is insulated from the semiconductor surface by an oxide layer.

In vertical MOSFETs, the source and drain electrodes are on opposite semiconductor surfaces and create current flow which is substantially vertical (perpendicular to the semiconductor surfaces) through the device. In vertical VDMOS devices, the substrate is substantially planar and the gate is on the same semiconductor surface as the source electrode. In vertical VMOS devices, a groove extends into the substrate from one surface and the gate is disposed on the surface of the groove.

Both varieties of conventional vertical MOSFETs are thus three layer devices having source, body and drain regions. In the present invention, a minority carrier injecting fourth semiconductor region, hereinafter referred to as an anode region, is introduced to a vertical MOSFET (or IGFET) structure. Although this creates a four layer device, the conductivities and geometries of the four semiconductor regions are manipulated so as not to form a regenerative thyristor. Bipolar effects are deliberately minimized. The four layer device of the present invention instead performs substantially as a field controlled transistor having improved operating characteristics compared to conventional vertical MOSFETs.

SUMMARY OF THE INVENTION

A vertical MOSFET includes a semiconductor substrate which includes, in series, adjacent source, body, drain and anode regions of alternate conductivity type. The body region is adjacent to a substrate surface and the source and drain regions are spaced so as to define a channel portion in the body region at that surface. The conductivities and configurations of the body and drain regions are adjusted so that the device functions substantially as a non-regenerative transistor. During device operation the anode region provides minority carrier injection into the drain region, thereby reducing device threshold voltage and on resistance while enhancing forward conductance.

DETAILED DESCRIPTION

Figure 1:
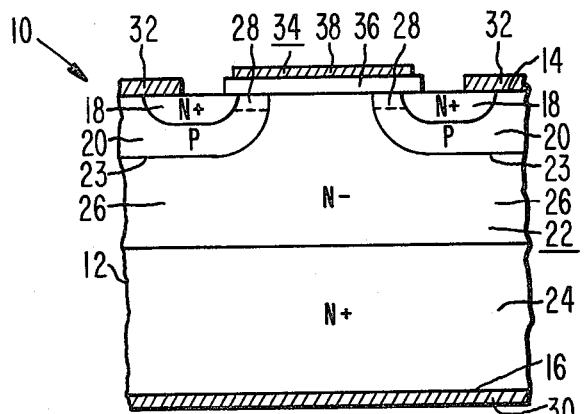
FIG. 1 is a sectional view of a conventional VDMOS device.

A conventional VDMOS device 10, illustrated in FIG. 1, includes a substantially planar substrate 12 having first and second opposing surfaces, 14 and 16 respectively, and adjacent source, body and drain regions, 18, 20 and 22 respectively, of alternate conductivity type. The drain region 22 typically comprises a relatively high conductivity portion 24 adjacent to the second surface 16 and an extended drain portion 26, of lower conductivity material, extending to the first surface 14. In a typical configuration, a pair of body regions 20, spaced apart by the extended drain region 26, extends into the substrate from the first surface 14 and forms a pair of body/drain PN junctions 23. A corresponding pair of source regions 18 extends into the substrate from the first surface 14 within the boundaries of the body regions 20. The source regions are located with respect to the extended drain region therebetween so as to define a pair of channel portions 28 at the first surface of each body region 20.

A drain electrode 30 is disposed across the second surface 16 and contacts the relatively high conductivity portion of the drain region 24. On the first surface a source electrode 32 contacts each source region 18 and body region 20 in an area displaced from the channel portion 28. A gate 34 is disposed on the first surface over both the pair of channel portions 28 and the extended drain region 26 between the channel portions. The gate 34 typically includes an oxide 36 on the substrate surface 14 and an electrode 38 over the oxide.

Figure 2:
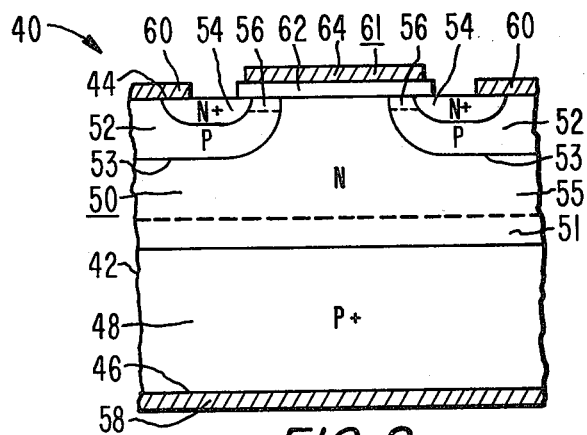
FIG. 2 is a sectional view of a VDMOS device embodying the present invention.

As illustrated in FIG. 2, a VDMOS device of the present invention 40 also comprises a substantially planar substrate 42 having first and second opposing major surfaces, 44 and 46 respectively. A substantially planar anode region 48 of first conductivity type is adjacent to the second major surface. A drain region 50 of second conductivity type is disposed across the anode region and extends to the first surface. A pair of body regions 52 of first conductivity type, spaced apart by the drain region 50, extends into the substrate from the first surface, forming a pair of body/drain PN junctions 53. A corresponding pair of source regions 54 of second conductivity type extends into the substrate from the first surface within the boundaries of the body regions 52. The source regions are located with respect to the drain region 50 therebetween so as to define a pair of channel portions 56 at the first surface of each body region 52.

An anode electrode 58 is disposed across the second surface, contacting the anode region 48. A pair of source electrodes 60, and a gate 61 comprising a gate oxide 62 and a gate electrode 64, are disposed on the first semiconductor surface in a configuration similar to the one described with reference to device 10. Although in the preferred embodiment the device 40 is a MOSFET and an oxide 62 underlies the electrode 64, it should be recognized that a functional device would also result if another insulating material(s) (such as Si3N4) was substituted for the oxide.

Figure 3:
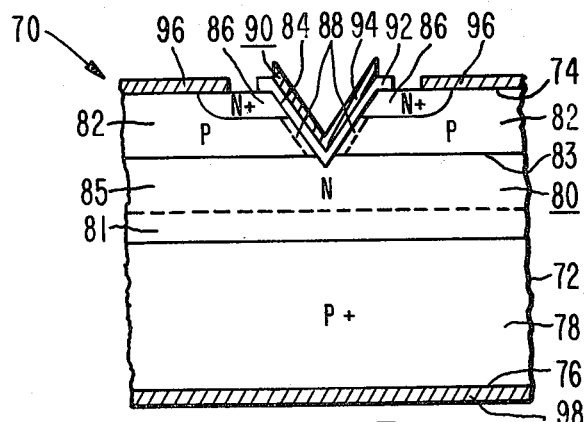
FIG. 3 is a sectional view of a VMOS device embodying the present invention.

The present invention embodied in a vertical, grooved MOSFET (VMOS) device 70 is illustrated in FIG. 3. The VMOS device 70 comprises a substrate 72 having first and second opposing major surfaces, 74 and 76 respectively. A substantially planar anode region 78 of first conductivity type is adjacent to the second surface and a substantially planar second conductivity type drain region 80 is disposed across the anode region. A body region 82 of first conductivity type extends into the substrate from the first surface 74 so as to form a body/drain PN junction 83 with the drain region 80.

A groove 84 extends into the substrate from the first surface 74 so as to intercept the body region 82. A pair of second conductivity type source regions 86, spaced by the groove 84, extends into the substrate from the first surface. Each source region is adjacent to the groove at the first surface and is spaced from the drain region 80 so as to define the length of a channel portion 88 at the groove surface of the body region 82.

It should be recognized that although in the illustrated embodiment the groove 84 is V-shaped, its shape is not so limited. For example, the groove might have a curved (e.g. U-shaped) profile, a generally rectangular profile (with walls perpendicular to the semiconductor surface 74) or a substantially V-shaped profile with a flat (i.e. parallel to semiconductor surface 74) bottom surface.

A gate 90 is disposed on the surface of the groove 84. It comprises an oxide 92 over the channel portions 88 and an electrode 94 over the oxide, although, again, another insulating material or materials may be substituted for the oxide 92. A pair of source electrodes 96 contacts the source and body regions at the first semiconductor surface 74 and an anode electrode 98 contacts the anode region 78 on the second semiconductor surface 76.

The principles of operation of the VMOS device 70 are substantially similar to those of the VDMOS device 40. The basic distinction is that in the VDMOS device the gate is located on a major semiconductor surface such that channel portions are induced in those portions of the body regions at the major semiconductor surface. In the VMOS device, the gate is located on a groove surface and induces channel portions in those portions of the body at the groove surface.

The invention is derived by manipulating the conductivities and geometries of the four semiconductor regions such that the device operates as a field effect transistor (FET) having a minority-carrier-injecting anode region in series with the drain region. Although it is a four layer device, it does not function as a thyristor having regenerative properties. Each of the four layer devices 40 and 70 can be considered to comprise two transistors; one consisting of the source, body and drain regions (hereinafter transistor 1) and one consisting of the anode, drain and body regions (hereinafter transistor 2). Transistor 1 has a forward current gain $\alpha_1$ from the source region to the drain region and transistor 2 has a forward current gain $\alpha_2$ from the anode region to the body region. In the present invention it is essential that the sum of the current gains $(\alpha_1+\alpha_2)$ of transistor 1 and transistor 2 not exceed unity. This limits charge carrier regeneration so that no thyristor action occurs. As long as $\alpha_1+\alpha_2<1$, operable devices will result if $\alpha_1>\alpha_2$, $\alpha_1<\alpha_2$ or $\alpha_1=\alpha_2$.

The current gains $\alpha_1$ and $\alpha_2$ can be manipulated, for example, by varying the relative conductivities of the body and drain regions while maintaining the source and anode regions at relatively high conductivity. For example, if the source/body/drain/anode conductivities are respectively N+/P+/N/P+, it will generally yield a device in which $\alpha_1<\alpha_2$. If the respective conductivities are N+/P/N+/P+ it will generally yield $\alpha_1>\alpha_2$.

When $\alpha_1>\alpha_2$ the result is a relatively sensitive device which exhibits a relatively low threshold voltage $V_{TH}$. The device will have a low on resistance $R_{ON}$, can be controlled with a relatively low gate voltage and will be particularly suitable for relatively low voltage switching applications. Generally, when $\alpha_1<\alpha_2$ a device having high forward conductance results. Although the $V_{TH}$ will be higher than in the prior $(\alpha_1>\alpha_2)$ structure, the improved forward conductance (created by anode to drain carrier injection) makes such a device particularly suitable for high voltage switching applications.

Further improvements in device performance (such as reduced $V_{TH}$, increased breakdown voltage and faster switching time) can be achieved by varying the conductivity profile within the drain region. For example, in either device 40 or 70 the drain region 50 or 80 can further comprise a substantially planar relatively high conductivity (N+) portion, 51 or 81 respectively, adjacent to the anode 48 or 78. The remainder of the drain 50 or 80 can comprise a relatively low conductivity (N−) extended drain region 55 or 85.

Figure 4:
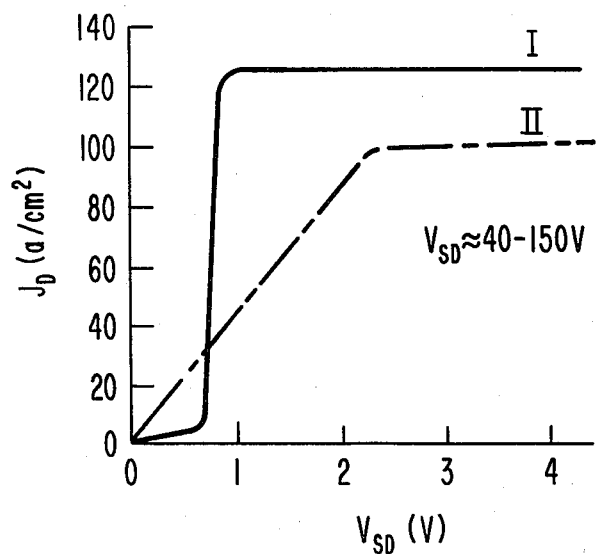
FIG. 4 is a graphic comparison of the electrical performance of a low voltage device of the present invention to that of a comparable conventional device.

As previously indicated, FETs embodying the present invention are suitable for both low and high voltage switching applications. When $\alpha_1>\alpha_2$ (e.g. $\alpha_1=0.7$ $\alpha_2=0.1$), the device is most appropriately suited for applications in which the source-drain voltage $V_{SD}$ is in the approximate range of 40–150 volts. An exemplary I-V (current-voltage) characterization for such a device is represented by curve I in FIG. 4. The abscissa is $V_{SD}$ in volts and the ordinate is current density $J_D$ in amps/active device area. Curve I represents the effective $R_{ON}$ when the device is operated at a particular gate-source voltage $V_{GS}$ which is significantly greater than $V_{TH}$. Curve II represents the $R_{ON}$ for a conventional device under similar operating conditions. At current densities above the point of intersection of the two curves, devices of the present invention exhibit lower forward voltage drop.

Figure 5:
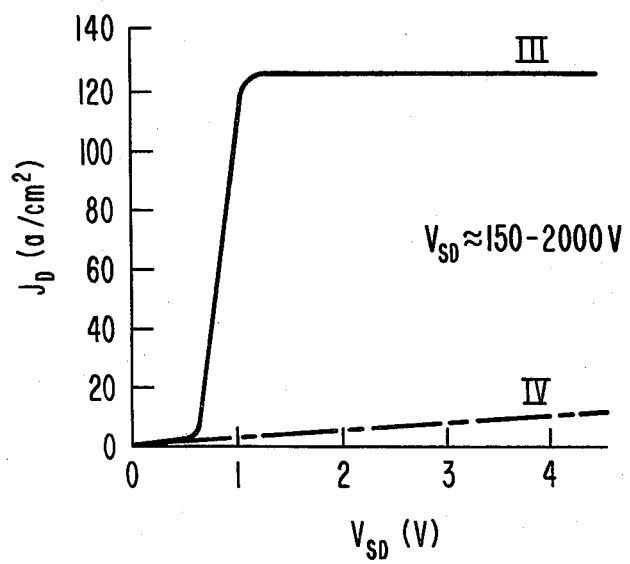
FIG. 5 is a graphic comparison of the electrical performance of a high voltage device of the present invention to that of a comparable conventional device.

In high voltage switching applications, where $V_{SD}$ is approximately 150–2000 volts, the present invention incorporates a structure in which $\alpha_1<\alpha_2$ (e.g. $\alpha_1=0.1$, $\alpha_2=0.7$). An approximate I-V characteristic for such a device is represented by curve III in FIG. 5 and the behavior of a comparable conventional device is represented by curve IV. In high voltage applications, the devices 40 and 70 exhibit very high conduction and very low $R_{ON}$ compared to conventional devices, although the $V_{TH}$ is somewhat increased compared to the low voltage device (curve I, FIG. 4).

It should be noted that the described VDMOS and VMOS devices 40 and 70, comprising a pair of source, body and channel regions, represent generalized preferred embodiments of the present invention. Devices incorporating a single body, source and channel region would also be functional. Furthermore, although the drawings illustrate semiconductor regions of a particular conductivity type, creating N channel devices, operational P channel devices would result if all indicated conductivity types were reversed.

It should also be recognized that both the VDMOS device 40 and VMOS device 70 can be incorporated into larger devices. For example, a larger device can include a plurality of portions each having the sectional view of the illustrated VDMOS device 40 or VMOS device 70. This plurality of devices might be in the form of an interdigitated, grid or meandering gate geometry as is commonly known in the semiconductor art.

What is claimed is:

1. A vertical MOSFET device, comprising:
   a semiconductor substrate, including in series, adjacent source, body, drain and anode regions of alternate conductivity type;
   the body region being adjacent to a surface of the substrate;
   the source and drain regions being spaced so as to define a channel portion in the body region at said surface;
   the source, body and drain regions having a first forward current gain $\alpha_1$ and the anode, drain and body regions having a second forward current gain $\alpha_2$, such that the sum $\alpha_1 + \alpha_2$ is less than unity, and no thyristor action occurs under any device operating conditions.

2. The device of claim 1, wherein:
   the current gain of the source, body and drain regions is greater than the current gain of the anode, drain and body regions.

3. The device of claim 1, wherein:
   the current gain of the source, body and drain regions is less than the current gain of the anode, drain and body regions.

4. The device of claim 1, further comprising:
   a source electrode contacting the source and body regions;
   a gate overlying the channel portion; and an anode electrode contacting the anode region.

5. The device of claim 4, further comprising:
   the substrate having first and second opposing major surfaces;
   a substantially planar anode region at the second surface;
   the drain region disposed across the anode region;
   the source electrode on the first surface; and
   the anode electrode on the second surface.

6. The device of claim 5, comprising a VDMOS transistor, wherein:
   the drain region extends to the first surface;
   the body region extends from the first surface and is bounded by the drain region; and
   the source region extends from the first surface within the boundaries of the body region.

7. The device of claim 6, further comprising:
   a pair of body regions, spaced apart by the drain region, extending into the substrate from the first surface;
   a pair of source regions, each extending into the substrate from the first surface within the boundaries of a body region; and
   a pair of channel portions, defined by the pair of source regions and the drain region therebetween.

8. The device of claim 7, wherein the gate comprises:
   an insulating layer overlying the pair of channel portions and the drain region therebetween; and
   an electrode overlying the insulating layer.

9. The device of claim 8, wherein:
   the insulating layer is oxide or silicon nitride.

10. The device of claim 5, comprising:
    a groove in the first substrate surface; and
    a channel portion along a surface of the groove.

11. The device of claims 5 or 10, in which the drain region comprises:
    a substantially planar portion, of relatively high conductivity, adjacent to the anode region; and
    an extended drain region, of relatively low conductivity, adjacent to the relatively high conductivity portion and to the body region.

12. The device of claim 10, comprising:
    the body region extending into the substrate from the first surface, bounded by the drain region;
    the groove extending from the first surface so as to intercept the body region; and
    a pair of source regions at the first surface, each being adjacent to the groove at the first surface.

13. The device of claim 12, wherein:
    the groove is substantially V-shaped, having two wall surfaces and a channel portion along each wall.

14. The device of claim 13, wherein:
    a gate overlies each channel portion.

15. The device of claim 14, wherein:
    the V-groove further comprises a substantially horizontal bottom surface.

16. The device of claim 12, wherein:
    the groove is substantially U-shaped, having two substantially vertical walls and a channel portion along each wall.

17. The device of claim 12, wherein:
    the groove is substantially rectangular in cross section, having two substantially vertical walls, a substantially horizontal bottom surface and a channel portion along each wall.

* * * * *